United States Patent
Ikeda et al.

(10) Patent No.: US 10,510,636 B2
(45) Date of Patent: Dec. 17, 2019

(54) ELECTRONIC MODULE

(71) Applicant: SHINDENGEN ELECTRIC MANUFACTURING CO., LTD., Tokyo (JP)

(72) Inventors: Kosuke Ikeda, Hanno (JP); Osamu Matsuzaki, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 16/073,745

(22) PCT Filed: Jul. 14, 2017

(86) PCT No.: PCT/JP2017/025640
§ 371 (c)(1),
(2) Date: Jul. 27, 2018

(87) PCT Pub. No.: WO2019/012677
PCT Pub. Date: Jan. 17, 2019

(65) Prior Publication Data
US 2019/0035707 A1    Jan. 31, 2019

(51) Int. Cl.
*H01L 23/28*    (2006.01)
*H01L 23/31*    (2006.01)
(Continued)

(52) U.S. Cl.
CPC ...... *H01L 23/3142* (2013.01); *H01L 21/4814* (2013.01); *H01L 23/12* (2013.01);
(Continued)

(58) Field of Classification Search
CPC . H01L 23/3142; H01L 23/66; H01L 21/4821; H01L 24/33–34
(Continued)

(56) References Cited

U.S. PATENT DOCUMENTS 4,730,232 A    3/1988    Lindberg
4,878,106 A * 10/1989    Sachs ................. H01L 23/3121
                                                       257/796
(Continued)

FOREIGN PATENT DOCUMENTS

DE    102015218369 A1    3/2017
EP        0488193 A1    6/1992
(Continued)

OTHER PUBLICATIONS

International Search Report for PCT/JP2017/025640 dated Oct. 9, 2017 and its English translation from Google Translate.
(Continued)

*Primary Examiner* — Nitin Parekh
(74) *Attorney, Agent, or Firm* — Ladas & Parry, LLP

(57) ABSTRACT

An electronic module comprises a substrate 11, 21, an other-side electronic component 18, 23 provided on the other side of the substrate 11, 21, a one-side electronic component 13, 28 provided on one side of the substrate 11, 21 and a connecting terminal 115, 125 having an other-side extending part 119a, 129a extending to circumferential outside of the substrate 11, 21 on the other side of the substrate 11, 21, a one-side extending part 119b, 129b extending to circumferential outside of the substrate 11, 21 on one side of the substrate 11, 21, and a connecting part 118, 128 connecting the other-side extending part 119a, 129a with the one-side extending part 119b, 129b at the circumferential outside of the substrate 11, 21.

6 Claims, 17 Drawing Sheets

(51) Int. Cl.
| | |
|---|---|
| *H01L 23/373* | (2006.01) |
| *H01L 23/495* | (2006.01) |
| *H01L 23/66* | (2006.01) |
| *H01L 23/00* | (2006.01) |
| *H01L 25/07* | (2006.01) |
| *H01L 21/48* | (2006.01) |
| *H01L 23/12* | (2006.01) |
| *H05K 5/06* | (2006.01) |

(52) U.S. Cl.
CPC .... *H01L 23/3735* (2013.01); *H01L 23/49555* (2013.01); *H01L 23/66* (2013.01); *H01L 24/33* (2013.01); *H01L 24/37* (2013.01); *H01L 25/07* (2013.01); *H05K 5/06* (2013.01); *H01L 23/49531* (2013.01); *H01L 23/49537* (2013.01); *H01L 23/49562* (2013.01); *H01L 23/49575* (2013.01); *H01L 24/29* (2013.01); *H01L 24/32* (2013.01); *H01L 24/40* (2013.01); *H01L 2224/291* (2013.01); *H01L 2224/29139* (2013.01); *H01L 2224/29147* (2013.01); *H01L 2224/32227* (2013.01); *H01L 2224/32245* (2013.01); *H01L 2224/32258* (2013.01); *H01L 2224/33181* (2013.01); *H01L 2224/37013* (2013.01); *H01L 2224/37147* (2013.01); *H01L 2224/4024* (2013.01); *H01L 2224/4026* (2013.01); *H01L 2224/40227* (2013.01); *H01L 2224/40245* (2013.01); *H01L 2224/40499* (2013.01); *H01L 2224/83447* (2013.01); *H01L 2924/181* (2013.01); *H01L 2924/19103* (2013.01); *H01L 2924/19104* (2013.01); *H01L 2924/19106* (2013.01)

(58) Field of Classification Search
USPC .......................................... 257/666, 696, 728
See application file for complete search history.

(56) References Cited

U.S. PATENT DOCUMENTS

| | | | | |
|---|---|---|---|---|
| 5,218,231 | A | 6/1993 | Kudo | |
| 5,408,128 | A * | 4/1995 | Furnival | H01L 23/49811 257/690 |
| 5,574,312 | A | 11/1996 | Reinhold et al. | |
| 6,566,750 | B1 * | 5/2003 | Sofue | H01L 24/49 257/678 |
| 7,875,962 | B2 * | 1/2011 | Balakrishnan | H01L 23/3107 257/666 |
| 9,147,666 | B2 * | 9/2015 | Yoshihara | H01L 23/645 |
| 10,026,673 | B2 * | 7/2018 | Okumura | H01L 25/18 |
| 2007/0196950 | A1 * | 8/2007 | Shirai | H01L 23/4952 438/106 |
| 2008/0054425 | A1 * | 3/2008 | Malhan | H01L 24/72 257/678 |
| 2012/0181679 | A1 * | 7/2012 | Kadoguchi | H01L 23/3142 257/676 |
| 2012/0300522 | A1 * | 11/2012 | Tokuyama | H01L 25/072 363/131 |
| 2013/0270706 | A1 | 10/2013 | Sugimura et al. | |
| 2014/0027891 | A1 * | 1/2014 | Kimura | H01L 23/3107 257/675 |
| 2014/0319673 | A1 | 10/2014 | Yueqiang et al. | |
| 2016/0111367 | A1 | 4/2016 | Park | |
| 2016/0358838 | A1 | 12/2016 | Basler et al. | |
| 2017/0085190 | A1 | 3/2017 | Nakajima et al. | |

FOREIGN PATENT DOCUMENTS

| | | |
|---|---|---|
| EP | 0631312 A1 | 12/1994 |
| EP | 3104411 A1 | 12/2016 |
| JP | S61166148 A | 7/1986 |
| JP | H08008397 A | 1/1996 |
| JP | H09107067 A | 4/1997 |
| JP | H11003955 A | 1/1999 |
| JP | 2005340639 A | 12/2005 |
| JP | 2013123040 A | 6/2013 |
| JP | 2013219268 A | 10/2013 |
| JP | 2014045157 A | 3/2014 |
| JP | 2014096412 A | 5/2014 |
| JP | 2015213412 A | 11/2015 |
| JP | 2015233036 A | 12/2015 |
| JP | 2016082213 A | 5/2016 |
| JP | 2016185067 A | 10/2016 |

OTHER PUBLICATIONS

Written Opinion of the International Searching Authority for PCT/JP2017/025640 dated Oct. 9, 2017 and its English translation from Google Translate.
International Preliminary Report on Patentability for PCT/JP2017/025640 dated Mar. 3, 2018 and its English translation from Google Translate.
Office action and search report from NL app. No. 2021292, dated Mar. 20, 2019, with English translation from NL Patent Office.
Office action and search report from NL app. No. 2021292, dated Mar. 20, 2019, with English translation from NP Patent Office.
Tanaka et al., "Multichip module for 156MB/S optical interface", Japan Int'l Electronics Manufacturing Technology Symposium, Jun. 9, 1993, pp. 81-84.

* cited by examiner

FIG. 8
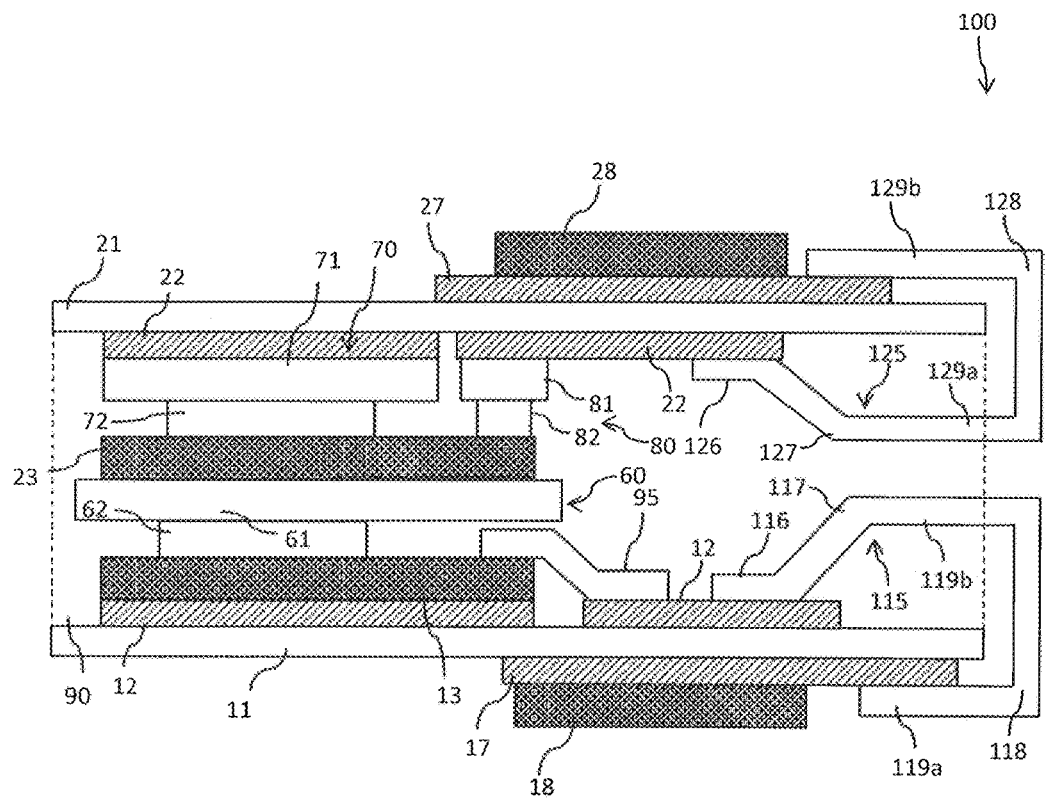

FIG. 17
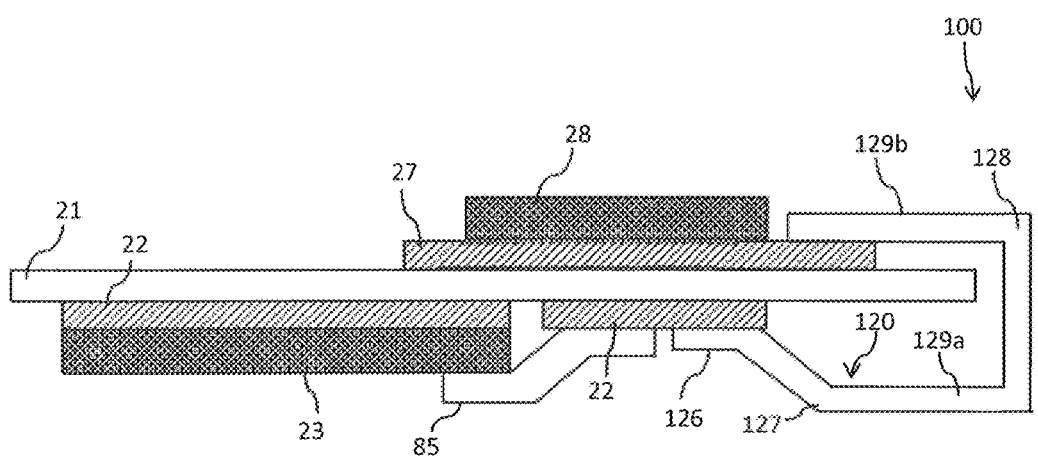

ELECTRONIC MODULE

CROSS-REFERENCE TO RELATED APPLICATION

The present application is the U.S. national phase of PCT Application PCT/JP2017/025640 filed on Jul. 14, 2017, the disclosure of which is incorporated herein by reference in its entirety.

TECHNICAL FIELD

The present invention relates to an electronic module having electronic components.

BACKGROUND ART

An electronic module including a plurality of electronic components provided in sealing resin, has been known conventionally (e.g., refer to JP 2014-45157 A). Such an electronic module is typically connected to an external device, such as a control board.

For example, in a case where an external device, such as a control board, is disposed on one side (front side) of an electronic module, the terminals of the electronic module extending to one side, are connected to the external device. According to such an aspect, because wiring distance is long, resistance or impedance may increase or trouble may occur due to noise.

SUMMARY OF INVENTION

Technical Problem

The present invention has been made in consideration of the problems, and an object of the present invention is to provide an electronic module capable of preventing an increase in resistance or impedance or preventing trouble from occurring due to noise.

Solution to Problem

An electronic module may comprise:
a substrate;
an other-side electronic component provided on the other side of the substrate;
a one-side electronic component provided on one side of the substrate; and
a connecting terminal having an other-side extending part extending to circumferential outside of the substrate on the other side of the substrate, a one-side extending part extending to circumferential outside of the substrate on one side of the substrate, and a connecting part connecting the other-side extending part with the one-side extending part at the circumferential outside of the substrate, the connecting terminal electrically connecting the other-side electronic component with the one-side electronic component.

In the electronic module according to the present invention,
the substrate may have a first substrate and a second substrate which is provided on one side of the substrate,
the other-side electronic component may have an other-side second electronic component provided on the other side of the second substrate,
the one-side electronic component may have a one-side second electronic component provided on one side of the second substrate, and
the connecting terminal may have a second connecting terminal, which has an other-side second extending part extending to circumferential outside of the second substrate on the other side of the second substrate, a one-side second extending part extending to circumferential outside of the second substrate on one side of the second substrate, and a second connecting past connecting the other-side second extending part with the one-side second extending part at circumferential outside of the second substrate, and the second connecting terminal electrically connects the other-side second electronic component with the one-side second electronic component.

The electronic module may further comprise
a first electronic component provided on one side of the first substrate; and
a first terminal part, which is provided on a first substrate side, electrically connected with the first electronic component,
the first terminal part may have a first planar-direction extending part extending in a planar direction of the first substrate, and a first normal-direction extending part, which is provided at an end of the first planar-direction extending part, extending to one side or the other side.

In the electronic module according to the present invention,
the first normal-direction extending part may extend to one side at circumferential outside of the second connecting part.

In the electronic module according to the present invention,
the substrate may have a first substrate and a second substrate which is provided on one side of the substrate, the other-side electronic component has an other-side first electronic component provided on the other side of the first substrate,
the one-side electronic component may have a one-side first electronic component provided on one side of the first substrate,
the connecting terminal may have a first connecting terminal, which has an other-side first extending part extending to circumferential outside of the first substrate on the other side of the first substrate, a one-side first extending part extending to circumferential outside of the first substrate on one side of the first substrate, and a first connecting part connecting the other-side first extending part with the one-side first extending part at circumferential outside of the first substrate, and the first connecting terminal electrically connects the other-side first electronic component with the one-side first electronic component.

In the electronic module according to the present invention,
the substrate may have a first substrate and a second substrate which is provided on one side of the substrate, the electronic module may further comprise a second terminal part, which is provided on a second substrate side, electrically connected with the second electronic component, the second terminal part may have a second planar-direction extending part extending in a planar direction of the second substrate, and a second normal-direction extending part, which is provided at an end of the second planar-direction extending part, extending to one side or the other side.

Advantageous Effects of Invention

By using the connecting terminal of the present invention, the electronic components can be disposed on both of the surface on one side and the surface on the other side of the substrate. Because the electronic components can be connected with the connecting terminal, the distance between the electronic components can be reduced. Thus, an increase in resistance or impedance can be prevented and trouble can be prevented from occurring due to noise. Because there is no need to provide the second substrate with a hole, such as a through-hole for connection between one side and the other side of the second substrate, it is advantageous in that a manufacturing process can be expected to be facilitated.

BRIEF DESCRIPTION OF DRAWINGS

FIG. 8 is a longitudinal sectional view of an electronic module to be used in a third embodiment of the present invention, the longitudinal sectional view being taken along a location corresponding to that of FIG. 1.

FIG. 17 is a longitudinal sectional view of another electronic module to be used in the eighth embodiment of the present invention.

DESCRIPTION OF EMBODIMENTS

First Embodiment

<<Configuration>>

Figure 1:
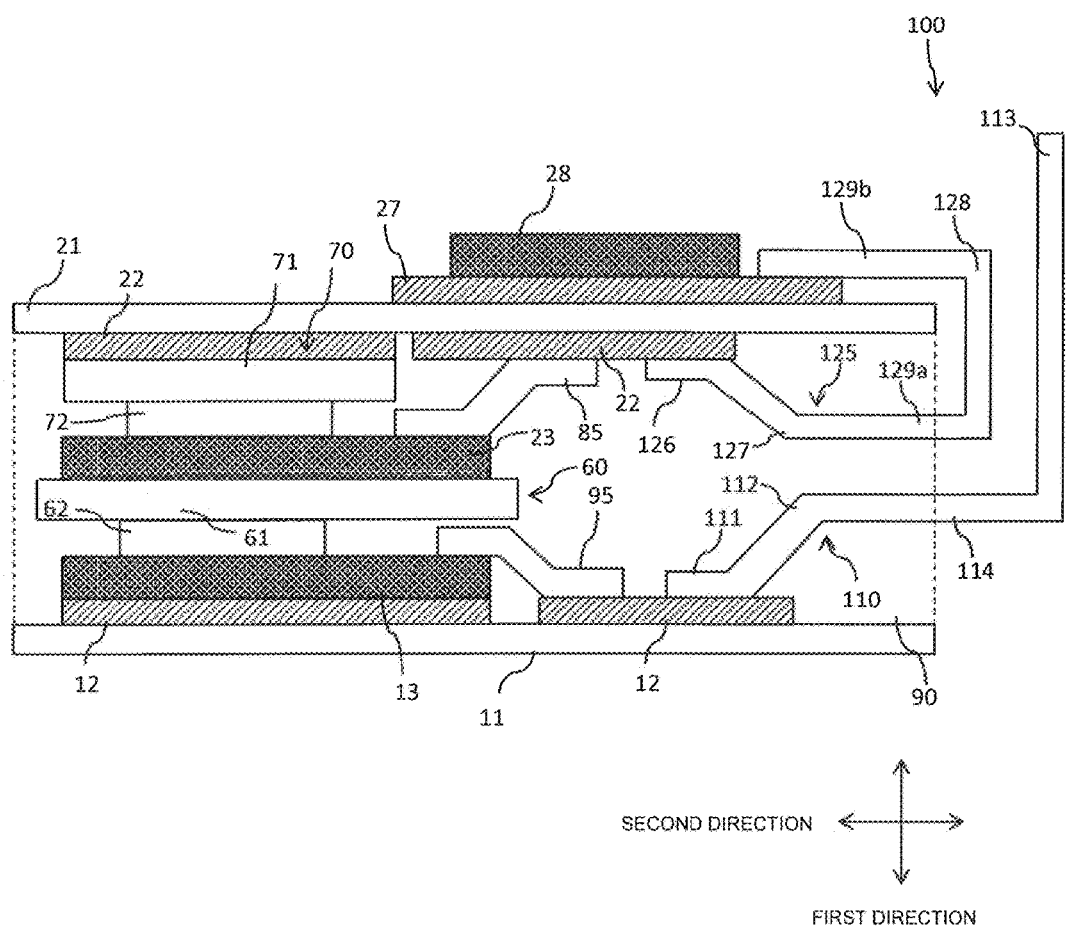
FIG. 1 is a longitudinal sectional view of an electronic module to be used in a first embodiment of the present invention.

In the present embodiment, a "one side" means the upper side of FIG. 1 and an "other side" means the lower side of FIG. 1. The up-and-down direction and right-and-left direction of FIG. 1, and front-and-back direct on of paper are referred toes a "first direction", a "second direction", and a "third direction", respectively. An in-plane direction including the second direction and the third direction, is referred to as a "planar direction" and is referred to as a "plan view" in a case where viewed from one side.

As illustrated in the present embodiment and different embodiments to be described later, electronic components may have other-side electronic components 18 and 23 provided on the other side of substrates 11 and 21, respectively, and one-side electronic components 13 and 28 provided on one side of the substrates 11 and 21, respectively. In a case where such an aspect is adopted, connecting terminals 115 and 125 may be provided, the connecting terminals 115 and 125 electrically connecting the other-side electronic components 18 and 23 with the one-side electronic components 13 and 28, respectively, the connecting terminals 115 and 125 having other-side extending parts 119a and 129a extending to circumferential outside of the substrates 11 and 21 on the other side of the substrates 11 and 21, respectively, one-side extending parts 119b and 129b extending to circumferential outside of the substrates 11 and 21 on one side of the substrates 11 and 21, respectively, and connecting parts 118 and 128 connecting the other-side extending parts 119a and 129a with the one-side extending parts 119b and 129b at the circumferential outside of the substrates 11 and 21, respectively The other-side extending parts 119a and 129a and the one-side extending parts 119b and 129b may be disposed completely overlapping, respectively, in the planar direction. Alternatively, the other side extending parts 119a and 129a and the one-side extending parts 119b and 129b may be disposed partially overlapping, respectively, in the planar direction.

The electronic components 13 and 23 sealed in a sealing part 90 to be described later each may be a power element, such as a switching element, and the electronic components 18 and 28 not sealed by the sealing part 90 each may be a control element. The present embodiment and different embodiments are not limited to that case, and thus the electronic components 13 and 23 sealed in the sealing part 90 each may be a control element, and the electronic components 18 and 28 not sealed by the sealing part 90 each may be a power element, such as a switching element. The electronic components 13, 18, 23, and 23 each may be a capacitor, a resistor, or a coil (also refer to FIG. 12). Note that, in a case where the electronic components 13 and 23 each include a switching element and the switching frequency of the switching element is radio-frequency, from the viewpoint of noise suppression, the electronic components 13, 18, 23, and 23 each preferably include a coil, and thus a transformer may be achieved by each of the electronic components 13, 18, 23, and 23.

An electronic module to be described below according to the present embodiment, may have a first electronic unit and a second electronic unit.

As illustrated in FIG. 1, the first electronic unit may have a first substrate 11, a plurality of one-side first conductive layers 12 provided on one side of the first substrate 11, and a one-side first electronic component 13 provided on one side of a one-side first conductive layer 12. The one-side first electronic component 13 may be a switching element or a control element. In a case where the one-side first electronic component 13 is the switching element, the one-side first electronic component 13 may be a MOSFET or IGBT. The one-side first electronic component 13, an other-side first electronic component 18 to be described later, an other-side second electronic component 23, and a one-side second electronic component 28 each may include a semiconductor element. Semiconductor material may be silicon, silicon carbide, or gallium nitride. The surface on the other side of the one-side first electronic component 13, may be connected with the one-side first conductive layer 12 through a conductive adhesive, such as solder (not illustrated).

A first connecting body 60 may be provided on one side of the one-side first electronic component 13. The first connecting body 60 may be connected with the surface on one side of the one-side first electronic component 13 through a conductive adhesive, such as solder.

As illustrated in FIG. 1, the second electronic unit may be provided on one side of the first connecting body 60. The second electronic unit may have the other-side second electronic component 23 provided on one side of the first connecting body 60. The second electronic unit may have a second substrate 21 and an other-side second conductive layer 22 provided on the other side of the second substrate 21. A second connecting body 70 may be provided on the other side of the other-side second conductive layer 22. The second connecting body 70 may be connected with the surface on one side of the other-side second electronic component 23 and the surface on the other side of the other-side second conductive layer 22 through conductive adhesives, such as solder.

The other-side second electronic component 23 may be a switching element or a control element. In a case where the other-side second electronic component 23 is the switching element, the other-side second electronic component 23 may be a MOSFET or IGBT.

A one-side second conductive layer 27 may be provided on one side of the second substrate 21. The one-side second conductive layer 27 may be provided with the one-side second electronic component 28.

The first connecting body 60 may have a first head part 61 and a first pillar part 62 extending from the first head part 61 to the other side. The second connecting body 70 may have a second head part 71 and a second pillar part 72 extending from the second head part 71 to the other side. The section of the first connecting body 60 may be substantially T-shaped and the section of the second connecting body 70 may be also substantially T-shaped.

Examples of the first substrate 11 and the second substrate 21 that can be adopted include ceramic substrates 11 and 21 and an insulating resin layer. In addition to solder, material containing Ag or Cu as a main ingredient, can be used as a conductive adhesive. Metal, such as Cu, can be used as the material of the first connecting body 60 and the second connecting body 70. Note that, for example, a metal substrate subjected to circuit patterning can be used as each of the substrates 11 and 21. In this case, the substrates 11 and 21 also serve as the conductive layers 12 and 22, respectively.

The electronic module may have a sealing part 90 including sealing resin, the sealing part 90 sealing the one-side first electronic component 13, the other-side second electronic component 23, the first connecting body 60, the second connecting body 70, the one-side first conductive layer 12, and the other-side second conductive layer 22, described above.

The present embodiment will be described with an exemplary aspect in which a second connecting terminal 125 is provided on the second substrate 21 side and no connecting terminal (first connecting terminal 115 to be described later) is provided on the first substrate 11 side. Note that the embodiment is not limited to this, and thus the first connecting terminal 115 may be provided on the first substrate 11 side as described later. In this case, no connecting terminal may be provided on the second substrate 21 side.

In the present embodiment, an other-side electronic component has the other-side second electronic component 23 provided on the other side of the second substrate 21, and a one-side electronic component has the one-side second electronic component 28 provided on one side of the second substrate 21. The second connecting terminal 125 described above has an other-side second extending part 129a extending to circumferential outside of the second substrate 21 on the other-side of the second substrate 21, a one-side second extending part 129b extending to circumferential outside of the second substrate 21 on one side of the second substrate 21 and a second connecting part 128 connecting the other-side second extending part 129a with the one-side second extending part 129b at circumferential outside of the second substrate 21. The second connecting terminal 125 electrically connects the other-side second electronic component 23 with the one-side second electronic component 28. In the aspect illustrated in FIG. 1, the one-side second extending part 129b of the second connecting terminal 125 is connected with the one-side second conductive layer 27, but the embodiment is not limited to this. Thus, the one-side second extending part 129b of the second connecting terminal 125 may be directly connected with the one-side second electronic component 28. A conductive adhesive, not illustrated, may be provided between the one-side second electronic component 28 and the one-side second conductive layer 27, and a conductive adhesive, not illustrated, may be provided between the one-side second extending part 129b and the one-side second conductive layer 27.

Figure 2:
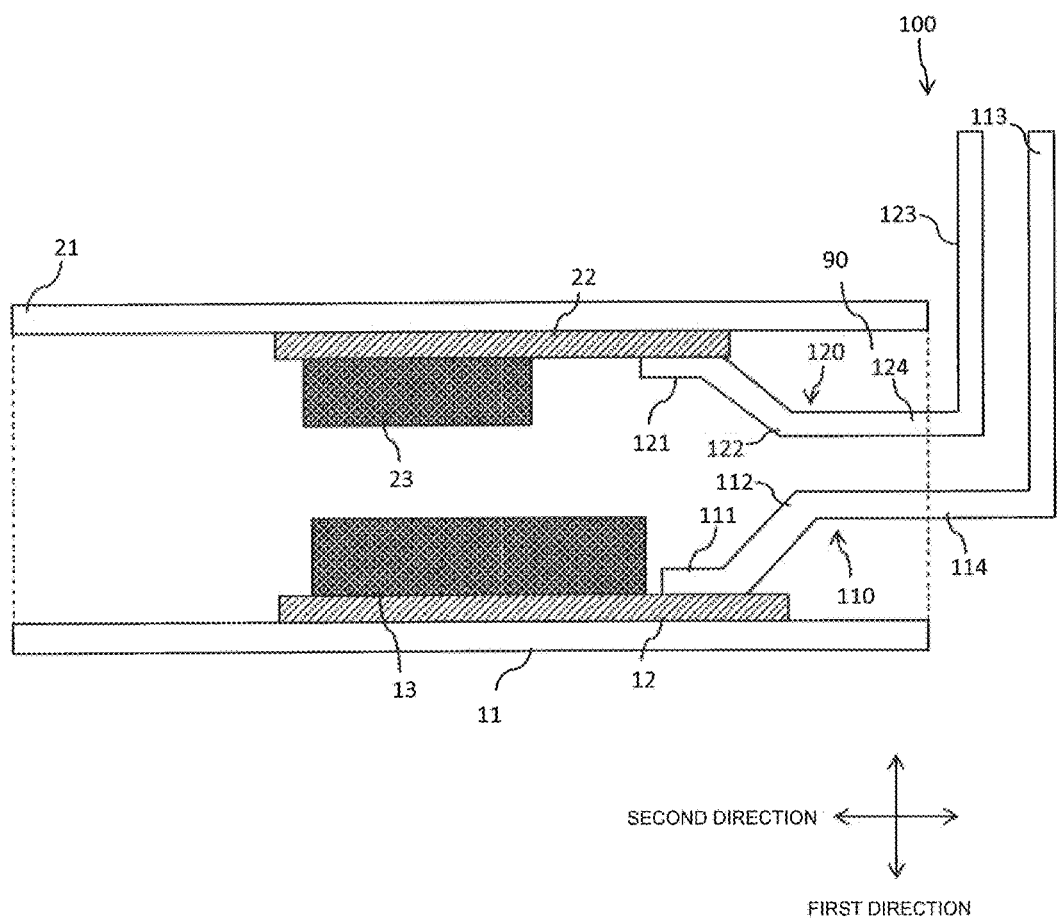
FIG. 2 is a longitudinal sectional view of the electronic module taken along a different location from that of FIG. 1.

As illustrated in FIG. 2, a second terminal part 120 electrically connected with an other-side second electronic component 23, may be provided on the second substrate 21 side. The second terminal part 120 may have a second planar-direction extending part 124 extending in the planar direction of the second substrate 21, and a second normal-direction extending part 123 provided at the end of the second planar-direction extending part 124, the second normal-direction extending part 123 extending to one side.

A first terminal part 110 electrically connected with a one-side first electronic component 13, may be provided on the first substrate 11 side. The first terminal part 110 may have a first planar-direction extending part 114 extending in the planar direction of the first substrate 11 and a first normal-direction extending part 113 provided at the end of the first planar-direction extending part 114, the first normal-direction extending part 113 extending to one side.

The first normal-direction extending parts 113 may extend to one side circumferential outside of the second connecting part 128 and the second normal direction extending part 123. In this case, the first planar-direction extending parts 114 extend to circumferential outside of the other-side second extending part 129a and the second planar-direction extending part 124. When viewed in the second direction (from the right sides of FIGS. 1 and 2), the second connecting part 128 and the first normal-direction extending part 113 may overlap each other entirely or partially and the second normal-direction extending part 123 and the first normal-direction extending part 113 may overlap each other entirely or partially. The embodiment is not limited to such an aspect, and thus, when viewed in the second direction, the second connecting part 128 and the first normal-direction extending part 113 may be arranged not overlapping each other at all and the second normal-direction extending part 123 and the first normal-direction extending part 113 may be arranged not overlapping each other at all.

A terminal part 100 according to the present embodiment includes each of the first terminal parts 110, the second terminal part 120, the first connecting terminal 115, described above, or the second connecting terminal 125 to be described later.

The one-side end of the first normal direction extending part 113 and the one-side end of the second normal-direction extending part 123, may extend to substantially identical positions. "Extension to substantially identical positions" means the presence of a difference between the two, the difference being not more than 5% of the total length of a normal-direction extending part shorter in length (second normal-direction extending part 123 in the present embodiment) from the first normal-direction extending part 113 and the second normal-direction extending part 123.

Figure 5:
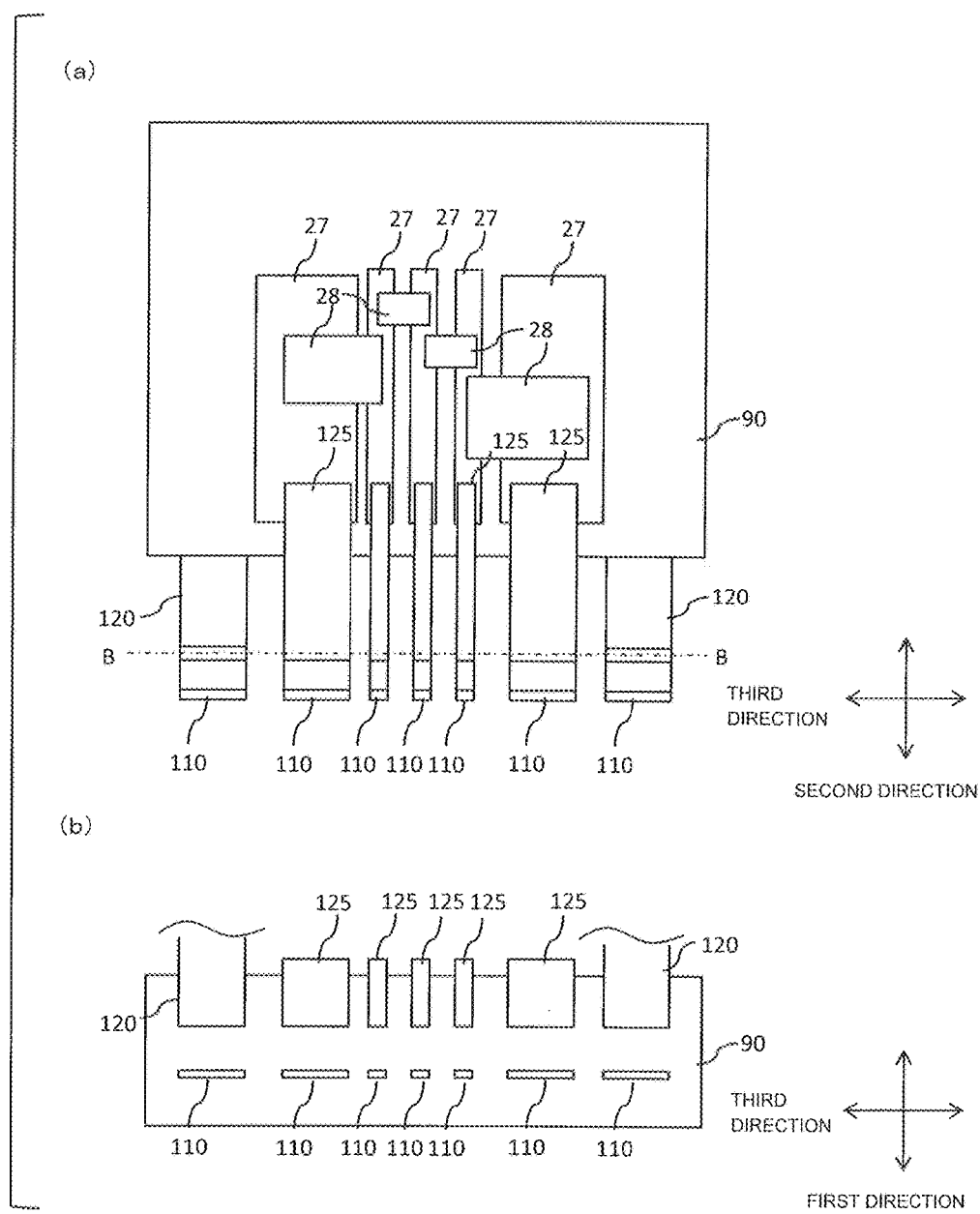
FIG. 5(a) is a plan view of the electronic module to be used in the first embodiment of the present invention.
FIG. 5(b) is a sectional view taken along line B-B of FIG. 5(a).

A plurality of first terminal parts 110 may be provided. Similarly, a plurality of second terminal parts 120 may be provided. The number of first terminal parts 110 may be identical to the total number of second terminal parts 120 and second connecting terminals 125. In a case where the number of first terminal parts 110 is identical to the total number of second terminal parts 120 and second connecting terminals 125, a second planar-direction extending part 124 or an other-side second extending part 129a may be provided on one side of each first planar-direction extending part 114 (refer to FIG. 5).

As illustrated in FIG. 1 the first terminal part 110 may have a first terminal base part 111 connected with the other one-side first conductive layer 12, the above first planar-direction extending part 114, and a first bent part 112 provided between the first terminal base part 111 and the first planar-direction extending part 114, the first bent part 112 being bent to the other side on the first terminal base part 111 side. The first terminal base part 111 may be connected to the surface on one side of the other one-side first conductive layer 12 through a conductive adhesive.

As illustrated in FIG. 2, the second terminal part 120 may have a second terminal base part 121 connected with an other-side second conductive layer 22, the above second planar-direction extending part 124, and a second bent part 122 provided between the second terminal base part 121 and the second planar-direction extending part 124, the second bent part 122 being bent to one side on the second terminal base part 121 side. The second terminal base part 121 may be connected to the surface on the other side of the other-side second conductive layer 22 through a conductive adhesive.

As illustrated in FIG. 1, the second connecting terminal 125 may have a second connecting terminal base part 126 connected with another other-side second conductive layer 22, the above other-side second extending part 129a, and a second bent part 127 provided between the second connecting terminal base part 126 and the other-side second extending part 129a, the second bent part 127 being bent to one side on the second connecting terminal base part 126 side. The second connecting terminal base part 126 may be connected to the surface on the other side of the another other-side second conductive layer 22 through a conductive adhesive.

The first planar-direction extending part 114 and the second planar-direction extending part 124, or, the first planar-direction extending part 114 and the other-side second extending part 129a may be at a distance of a threshold value or more in the first direction outside the sealing part 90. The threshold value may be a numerical value determined on the basis of safety standards. For example, in a case where electronic components use a voltage of 600 V, the first planar-direction extending part 114 and the second planar-direction extending part 124, or, the first planar-direction extending part 114 and the other-side second extending part 129a are required to be at a distance of 36 mm or more. In this case, the threshold value is 3.6 mm.

Figure 3:
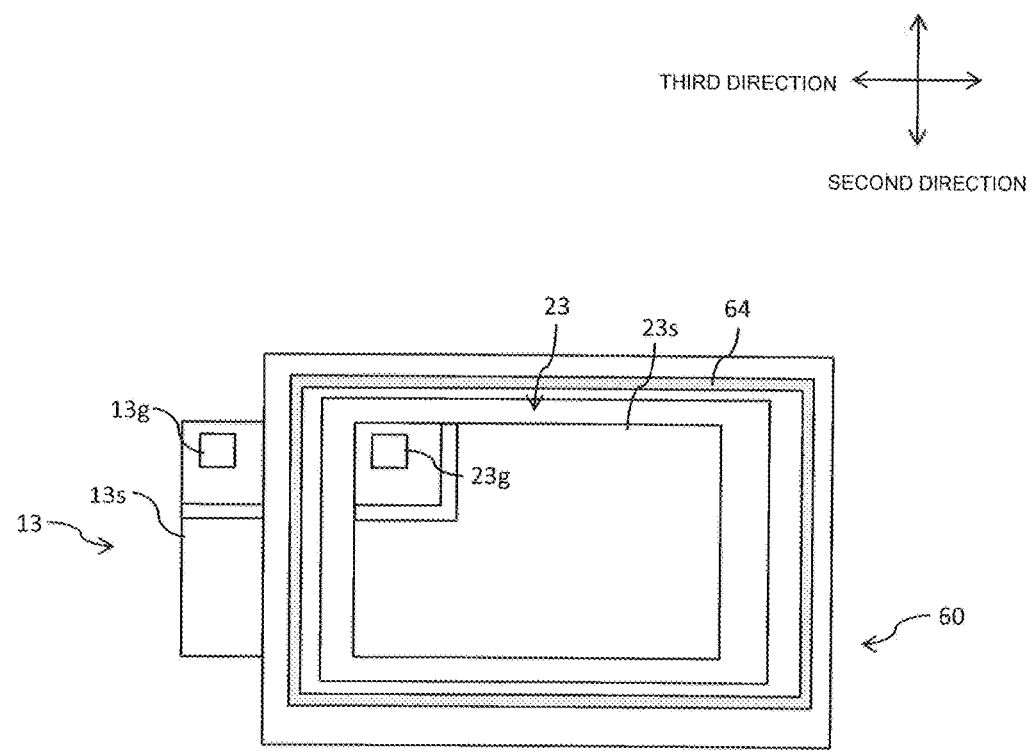
FIG. 3 is a plan view of a first connecting body to be used in the first embodiment of the present invention.

As illustrated in FIG. 3, a first groove part 64 may be provided on the surface on one side of the first head part 61. The first groove part 64 is provided outside the circumference of the first pillar part 62 in plan view (planar direction), but may be provided partially outside or provided entirely outside the first pillar part 62. A conductive adhesive, such as solder, may be provided on the surface on one side of the first head part 61, inside the the first groove part 64, and the other-side second electronic component 23 may be provided through the conductive adhesive.

Figure 4:
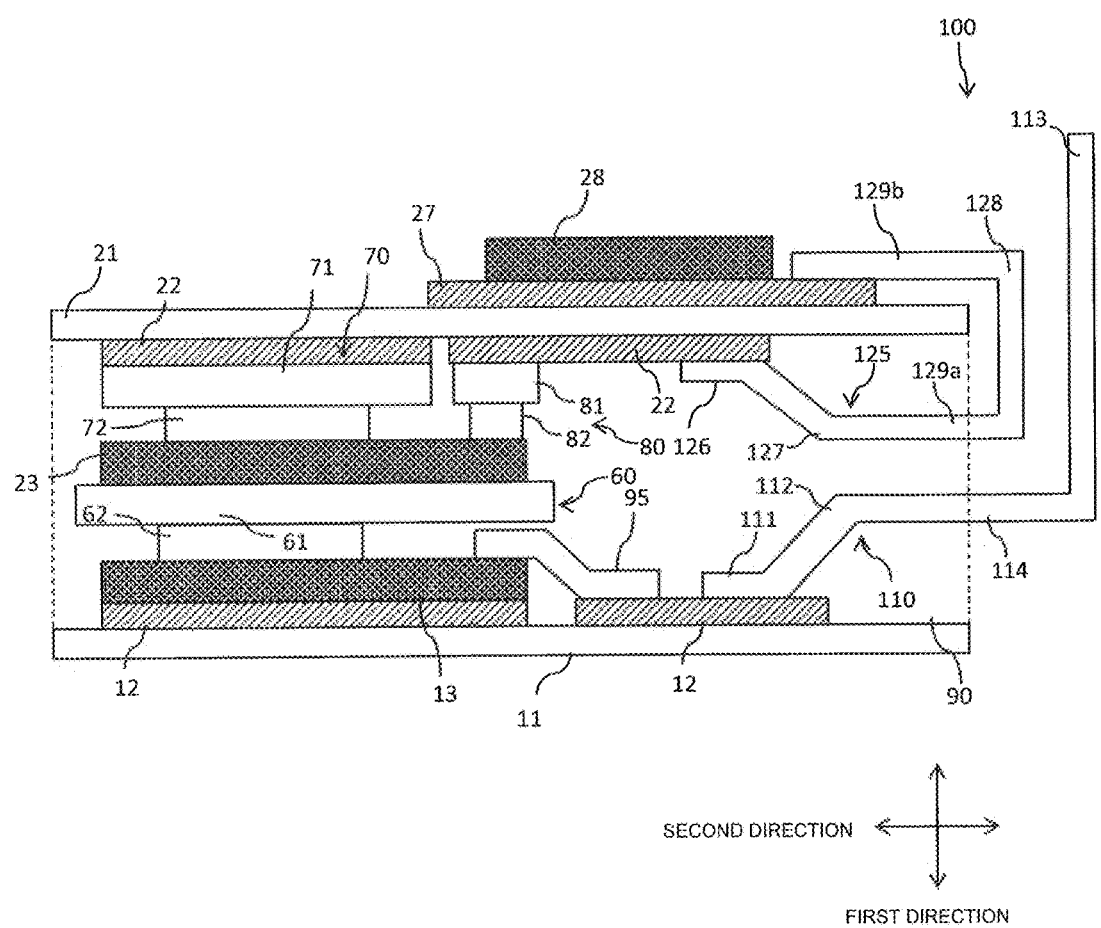
FIG. 4 is a longitudinal sectional view of another exemplary electronic module to be used in the first embodiment of the present invention.

As illustrated in FIG. 1, a connector 85 may be used, the connector 85 being connected with a terminal, such as a second gate terminal 23g to be described later of the other-side second electronic component 23. The embodiment is not limited to such an aspect, and thus a third connecting body 80 may be used as illustrated in FIG. 4. The third connecting body 80 may have a third head part 81, and a third pillar part 82 extending from the third head part 81 to the other side. The third connecting body 80 may be connected to the surface on the other side of the other-side second conductive layer 22 and the surface on one side of the other-side second electronic component 23 through conductive adhesives, such as solder.

The one-side first electronic component 3 illustrated in FIG. 3 is a switching element having a first gate terminal 13g and a first source terminal 13s on a surface on one side. The other-side second electronic component 23 illustrated in FIG. 3 is a switching element having the second gate terminal 23g and a second source terminal 23s on a surface on one side. In this case, the second connecting body 70 may be connected with the second source terminal 23s of the other-side second electronic component 23 through a conductive adhesive. The connector 85 may be connected with the second gate terminal 23g of the other-side second electronic component 23 through a conductive adhesive. The first connecting body 60 may connect the first source terminal 13s of the one-side first electronic component 13 with a second drain terminal provided on the other side of the other-side second electronic component 23 through a conductive adhesive. A first drain terminal provided on the other side of the one-side first electronic component 13, may be connected with the one-side first conductive layer 12 through a conductive adhesive. The first gate terminal 13g of the one-side first electronic component 13 may be connected with a connector 95 through a conductive adhesive (refer to FIG. 1). The connector 95 may be connected with the other one-side first conductive layer 12 through a conductive adhesive.

In a case where only one of the one-side first electronic component 13 and the other-side second electronic component 23 is a switching element, it can be thought that the other-side second electronic component 23 mounted on the first connecting body 60 is a low-heating control element and the one-side first electronic component 13 is the switching element. Conversely, it can be thought that the other-side second electronic component 23 mounted on the first connecting body 60 is the switching element and the one-side first electronic component 13 is the low-heating control element.

The bonding between the terminal parts 100 and the conductive layers 12 and 22, may be made by laser welding or by ultrasonic bonding, in addition to the aspect of the use of conductive adhesive, such as solder.

<<Function and Effect

Next, exemplary function and effect according to the present embodiment including the configuration described above, will be described. Note that any aspect to be described in "function and effect" can be adopted with the configuration.

As illustrated in FIG. 1, by adoption of the aspect in which the second connecting terminal 125 has the other-side second extending part 129a extending to the outside of the second substrate 21 on the other side of the second substrate 21, the one-side second extending part 129b extending to the outside of the second substrate 21 on one side of the second substrate 21, and the second connecting part 128 connecting the other-side second extending part 129a with the one-side second extending part 129b outside the second substrate 21, the second connecting terminal 125 electrically connecting the other-side second electronic component 23 with the one-side second electronic component 28, the electronic components can be disposed on both of the surface on one side and the surface on the other side of the second substrate 21. Because the electronic components can be connected with the second connecting terminal 125, the distance between the electronic components can be reduced. Thus, an increase in resistance or impedance can be prevented and trouble can be prevented from occurring due to noise. According to the present embodiment, because there is no need to provide the second substrate 21 with a hole, such as a through-hole for connection between one side and the other side of the second substrate 21, it is advantageous in that a manufacturing process can be expected to be facilitated.

Note that, in a case where the other-side second electronic component 23 includes a power element, such as a switching element, the one-side second electronic component 28 may include a control element that controls the power element. In a case where a plurality of other-side second electronic components 23 is provided, the other-side second electronic components 23 each may be a power element. In this case, a plurality of one-side second electronic components 28 may be provided, the one-side second electronic components 28 each being a control element. Note that, the embodiment is not limited to such an aspect, and thus some of the plurality of other-side second electronic components 23 provided may be power elements, and the remaining electronic components each may be a control element or a different electronic component (e.g., a resistor, a capacitor, or a coil).

Some of the plurality of one-side second electronic components 28 provided, may be control elements, and the remaining electronic components each may be a power element or a different electronic component (e.g., a resistor, a capacitor, or a coil). Note that disposing a switching element in the sealing part 90 is advantageous in that the influence of noise due to the switching element can be reduced. In a case where the one-side second electronic component 28 or the other-side second electronic component 23 includes a power element and a control element, because the control element can control the power element, the electronic module according to the present embodiment, is not necessarily connected to a control board.

As illustrated in FIG. 2, by adoption of the aspect in which the second terminal part 120 is provided on the second substrate 21, the second terminal part 120 being electrically connected with the other-side second electronic component 23, the second terminal part 120 having the second planar-direction extending part 124 extending in the planar direction of the second substrate 21, and the second normal-direction extending part 123 provided at the end of the second planar-direction extending part 124, the second normal-direction extending part 123 extending to one side, it is advantageous in that the use of the second terminal part 120 allows for connection with an external device, such as the control board. Note that the control board is used in order to control the electronic module.

As illustrated in FIGS. 1 and 2, by adoption of the aspect in which the first terminal part 110 is provided on the first substrate 11, the first terminal part 110 electrically connecting with the one-side first electronic component 13, the first terminal part 110 having the first planar-direction extending part 114 extending in the planar direction of the first substrate 11, and the first normal-direction extending part 113 provided at the end of the first planar-direction extending part 114, the first normal-direction extending part 113 extending to one side, it is advantageous in that the use of the first terminal part 110 allows for connection with an external device, such as the control substrate.

By adoption of the aspect in which the first normal-direction extending part 113 extends to one side at circumferential outside of the second connecting part 128, it is advantageous in that the second connecting part 128 and the first terminal part 110 can be securely prevented from being in contact with each other, in that the second connecting part 128 and the first terminal part 110 can be used in the third direction without the limitations of space, and in that the flexibility of design can improve.

By adoption of the aspect in which the first normal-direction extending part 113 extends to one side at circumferential outside of the second normal-direction extending part 123, it is advantageous in that the second terminal part 120 and the first terminal part 110 can be securely prevented from being in contact with each other in that the second terminal part 120 and the first terminal part 110 can be used in the third direction without the limitations of space and in that the flexibility of design can improve.

By adoption of the aspect in which the first normal-direction extending part 113 and the second normal-direction extending part 123 extend in the same direction and extend to one side in the aspect illustrated in FIG. 1, it is advantageous in that the first terminal part 110 and the second terminal part 120 can be connected to the same external device.

By adoption of the aspect in which the one-side end of the first normal-direction extending part 113 and the one-side end of the second normal-direction extending part 123 extend to the substantially identical positions, it is advantageous in that the first terminal part 110 and the second terminal part 120 can be connected to the same external device, such as the control substrate, more easily.

Second Embodiment

Next, a second embodiment of the present invention will be described.

Figure 6:
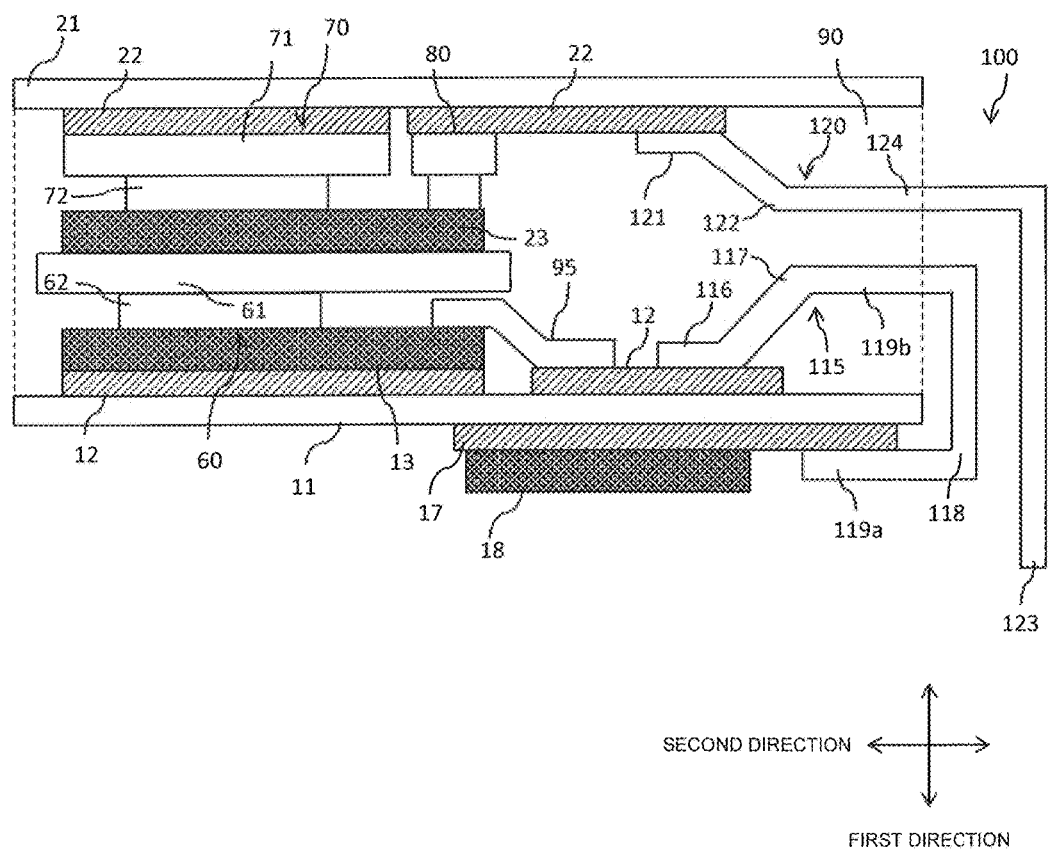
FIG. 6 is a longitudinal sectional view of an electronic module to be used in a second embodiment of the present invention, the longitudinal sectional view being taken along a location corresponding to that of FIG. 1.

Although the aspect in which the electronic components are provided on both surfaces of the second substrate 21, is given in the first embodiment, an aspect in which electronic components are provided on both surfaces of a first substrate 11, is given in the present embodiment. More specifically, as illustrated in FIG. 6, an other-side electronic component has an other-side first electronic component 18 provided on the other side of the first substrate 11, and a one-side electronic component has a one-side first electronic component 13 provided on one side of a second substrate 21. A connecting terminal has a first connecting terminal 115. The first connecting terminal 115 has an other-side first extending part 119*a* extending to circumferential outside of the first substrate 11 on the other side of the first substrate 11, a one-side first extending part 119*b* extending to circumferential outside of the first substrate 11 on one side of the first substrate 11 and a first connecting part 118 connecting the other-side first extending part 119*a* with the one-side first extending part 119*b* at circumferential outside of the first substrate 11. The first connecting terminal 115 electrically connects the other-side first electronic component 18 with the one-side first electronic component 13, In the aspect illustrated in FIG. 6, the other-side first extending part 119*a* of the first connecting terminal 115 is connected to an other-side first conductive layer 17, but the embodiment is not limited to this. Thus, the other-side first extending part 119*a* of the first connecting terminal 115 may be directly connected to the other-side second electronic component 18. A conductive adhesive, not illustrated, may be provided between the other-side second electronic component 18 and the other-side first conductive layer 17, and a conductive adhesive, not illustrated, may be provided between the other-side first extending part 119*a* and the other-side first conductive layer 17. Any aspect described in the embodiments can be adopted in the present embodiment, Members the same as the members described in the embodiments, will be described with the same reference signs.

According to the present embodiment, the above function achieved on the second substrate 21 side can be achieved even on the first substrate 11 side. Thus, as necessary, the aspect of the present embodiment can be adopted instead of the aspect of the first embodiment.

Figure 7:
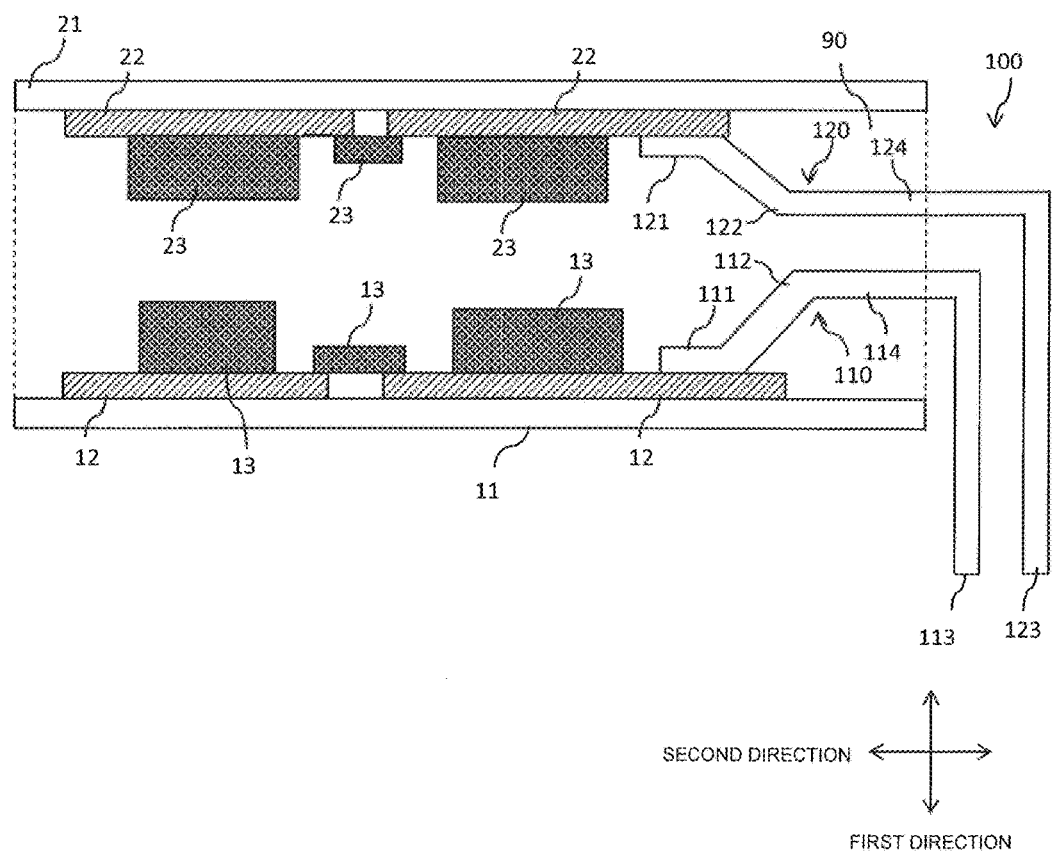
FIG. 7 is a longitudinal sectional view of the electronic module taken along a different location from that of FIG. 6, illustrating a different aspect from that of FIG. 2 for the arrangement of conductive layers and electronic components.

In the present embodiment, as illustrated in FIG. 7, a first normal-direction extending part 113 of a first terminal part 110, may extend to the other side. A second normal-direction extending part 123 of a second terminal part 120 may extend to the other side. In a case where such an aspect has been adopted, the first terminal part 110 and the second terminal part 120 are capable of connecting with an external device, such as a control board, provided on the other side of the first substrate 11.

Third Embodiment

Next, a third embodiment of the present invention will be described.

Figure 9:
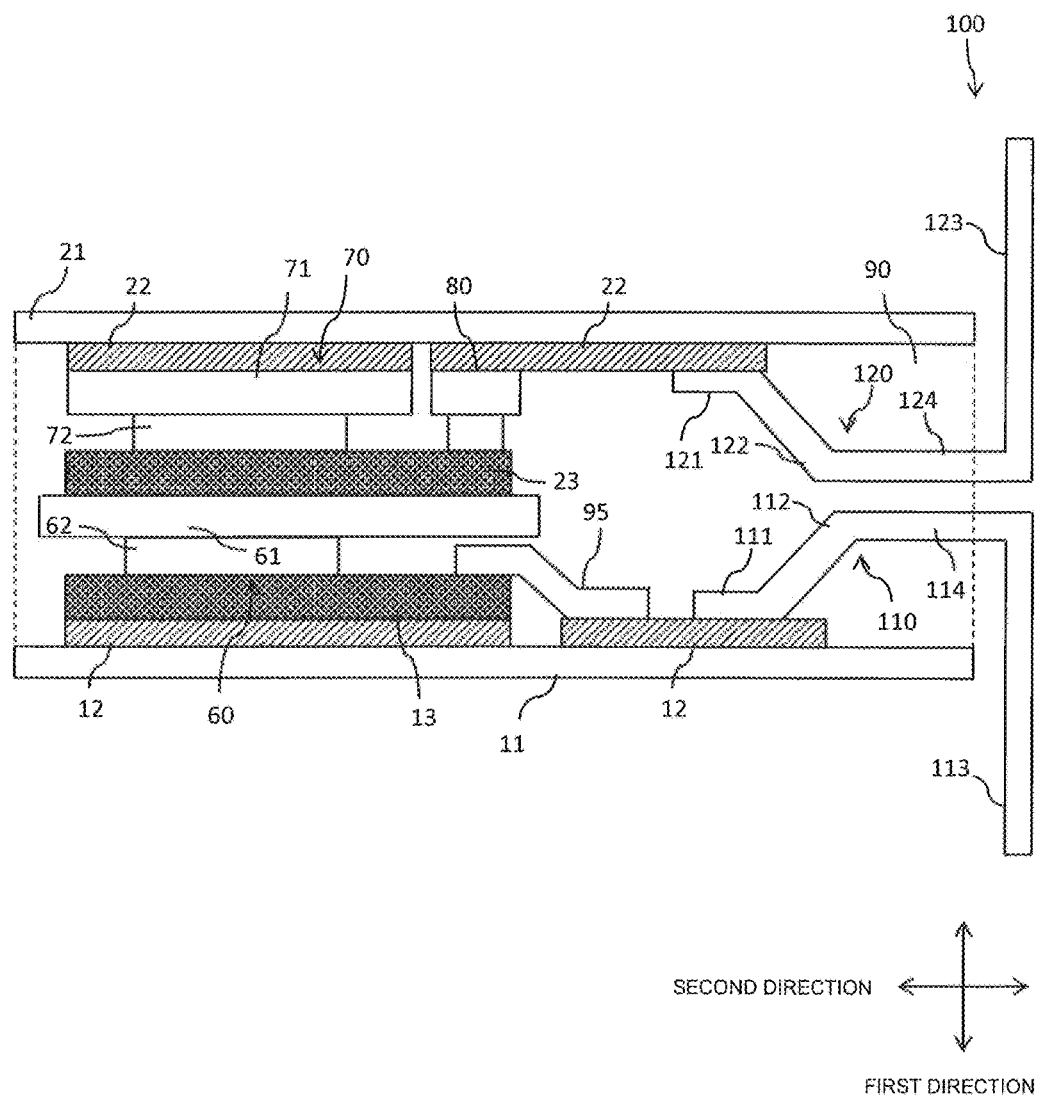
FIG. 9 is a longitudinal sectional view of the electronic module taken along a different location from that of FIG. 8, illustrating a different aspect from those of FIGS. 2 and 7 for the arrangement of conductive layers and electronic components.
Figure 10:
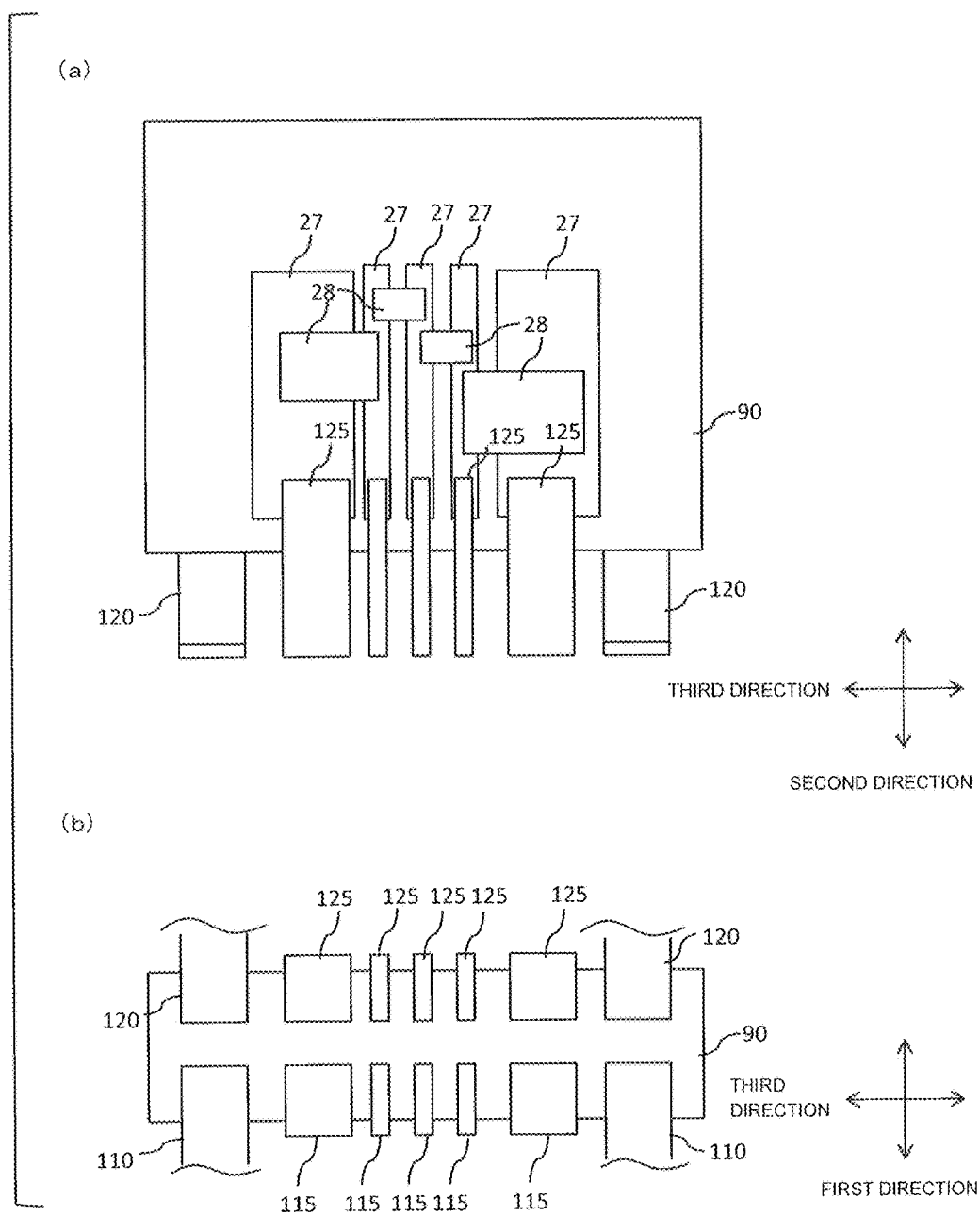
FIG. 10(a) is a plan view of the electronic module to be used in the third embodiment of the present invention.
FIG. 10(b) is a sectional view corresponding to that of FIG. 5(b).

As illustrated in FIGS. 8 and 10, a first connecting terminal 115 and a second connecting terminal 125 both are provided in the present embodiment. As illustrated in FIGS. 9 and 10, an aspect in which a first normal-direction extending part 113 of a first terminal part 110 extends to the other side and a second normal-direction extending part 123 of a second terminal part 120 extends to one side, is given in the present embodiment. The present embodiment can adopt any aspect described in the embodiments. Members the same as the members described in the embodiments, will be described with the same reference signs.

In the present embodiment, the connecting terminals 115 and 125 can be provided on a first substrate 11 and second substrate 21, respectively. The first terminal part 110 is capable of connecting with an external device, such as a control board, provided on the other side, and the second terminal part 120 is capable of connecting with an external device, such as a control board, provided on one side.

In the present embodiment, the connecting terminals 115 and 125 and the terminal parts 110 and 120 do not overlap each other in a plane including the first direction and the third direction, as illustrated in FIG. 10(*b*). Thus, one of the terminal parts 110 and 120 is not required to extend to the circumferential outside, so that a reduction can be made in length in the second direction and furthermore an increase can be inhibited in size in the planar direction.

Fourth Embodiment

Next, a fourth embodiment of the present invention will be described.

Figure 11:
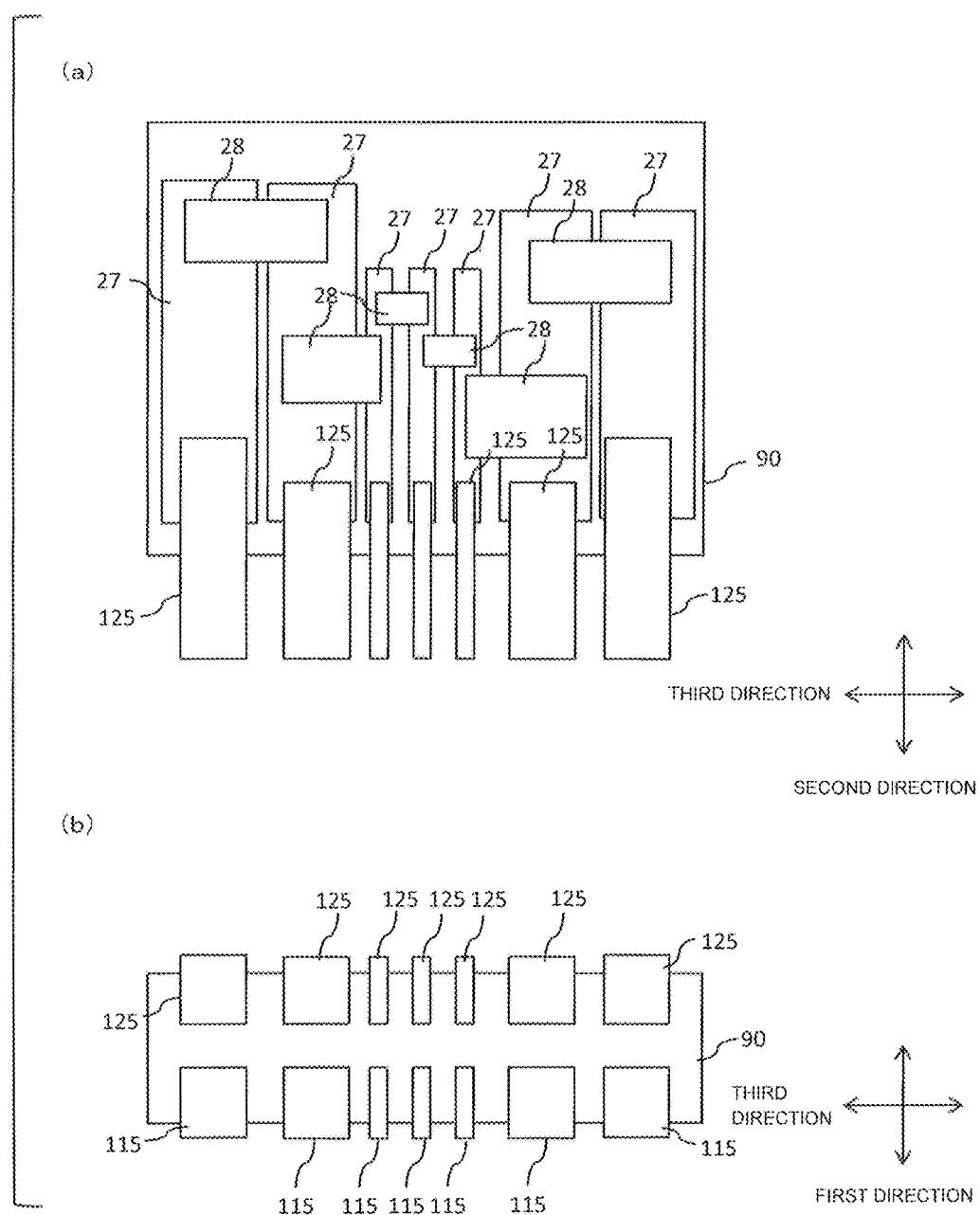
FIG. 11(a) is a plan view of an electronic module to be used in a fourth embodiment of the present invention.
FIG. 11(b) is a sectional view corresponding to that of FIG. 5(b).

As illustrated in FIG. 11, an aspect in which second connecting terminals 125 are provided but no second terminal part 120 is provided on the second substrate 21 side, is given in the present embodiment. Similarly, an aspect in which first connecting terminals 115 are provided but no first terminal part 110 is provided on the first substrate 11 side, is given. The present embodiment can adopt any aspect described in the embodiments. Members the same as the members described in the embodiments, will be described with the same reference signs.

According to the present embodiment, because no first terminal part 110 and no second terminal part 120 are provided, an electronic module can be reduced in size in the first direction (thickness direction). In a case where the aspect is adopted, an other-side first electronic component 18 disposed on the other side of the first substrate 11, may include a control element, and a one-side first electronic component 13 that is disposed on one side of the first substrate 11 and is sealed by a sealing part 90, may include a power element, such as a switching element. An other-side first electronic component 18 that is disposed on the other side of the second substrate 21 and is sealed by the sealing part 90, may include a power element, such as a switching element, and a one-side second electronic component 28 disposed on one side of the second substrate 21, may include a control element.

Note that, as in the present embodiment, in a case where a power element and a control element that controls the power element both are provided on each of the substrates 11 and 12 and the electronic module itself can control the power elements, the electronic module not being connected with an external device, such as a control board, it is advantageous in that a device can be remarkably reduced in size in comparison to a conventional configuration with a control board.

Fifth Embodiment

Next, a fifth embodiment of the present invention will be described.

Figure 12:
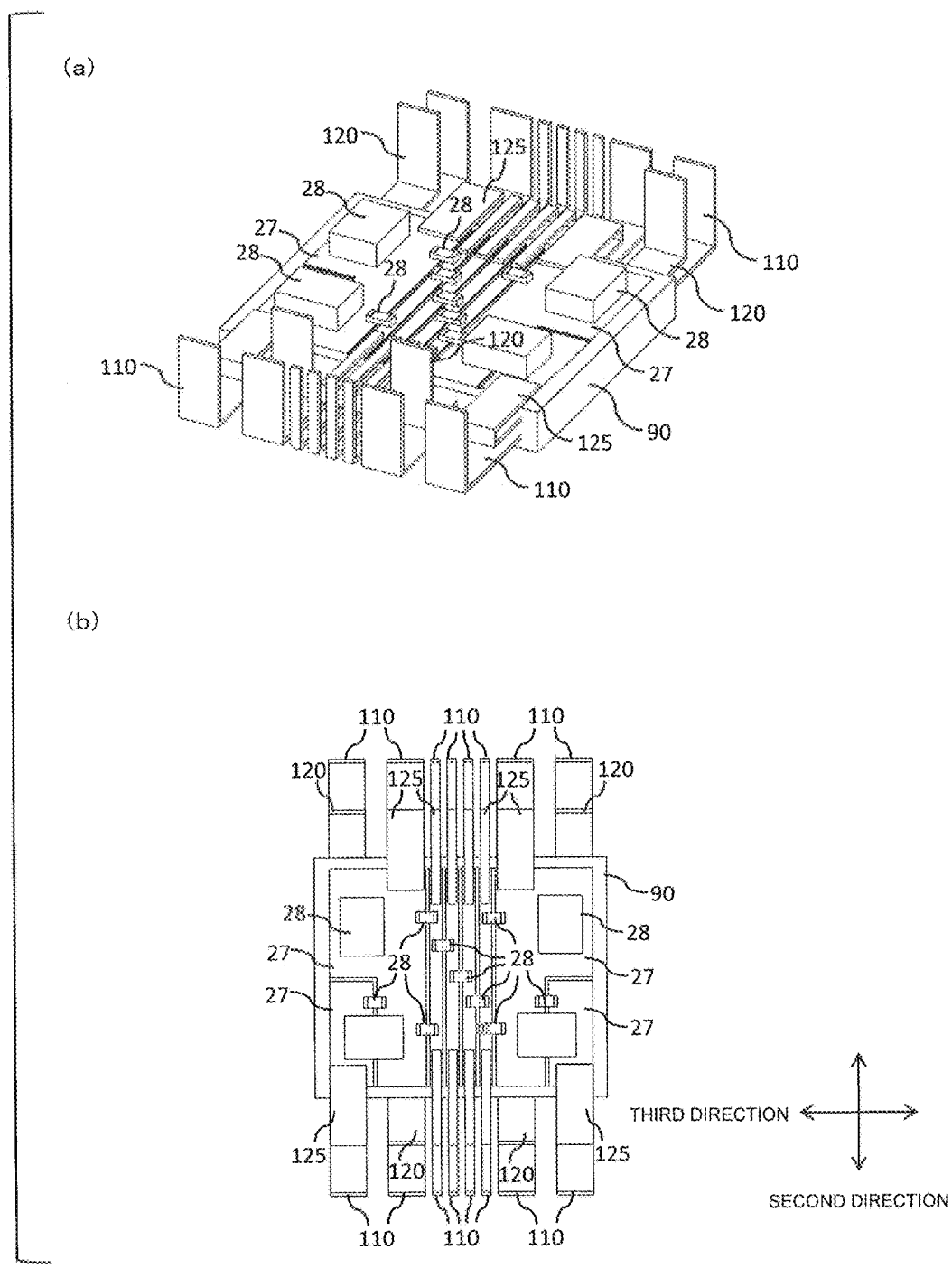
FIG. 12(a) is a perspective view of an electronic module to be used in a fifth embodiment of the present invention.
FIG. 12(b) is a plan view of the electronic module to be used in the fifth embodiment of the present invention.
Figure 13:
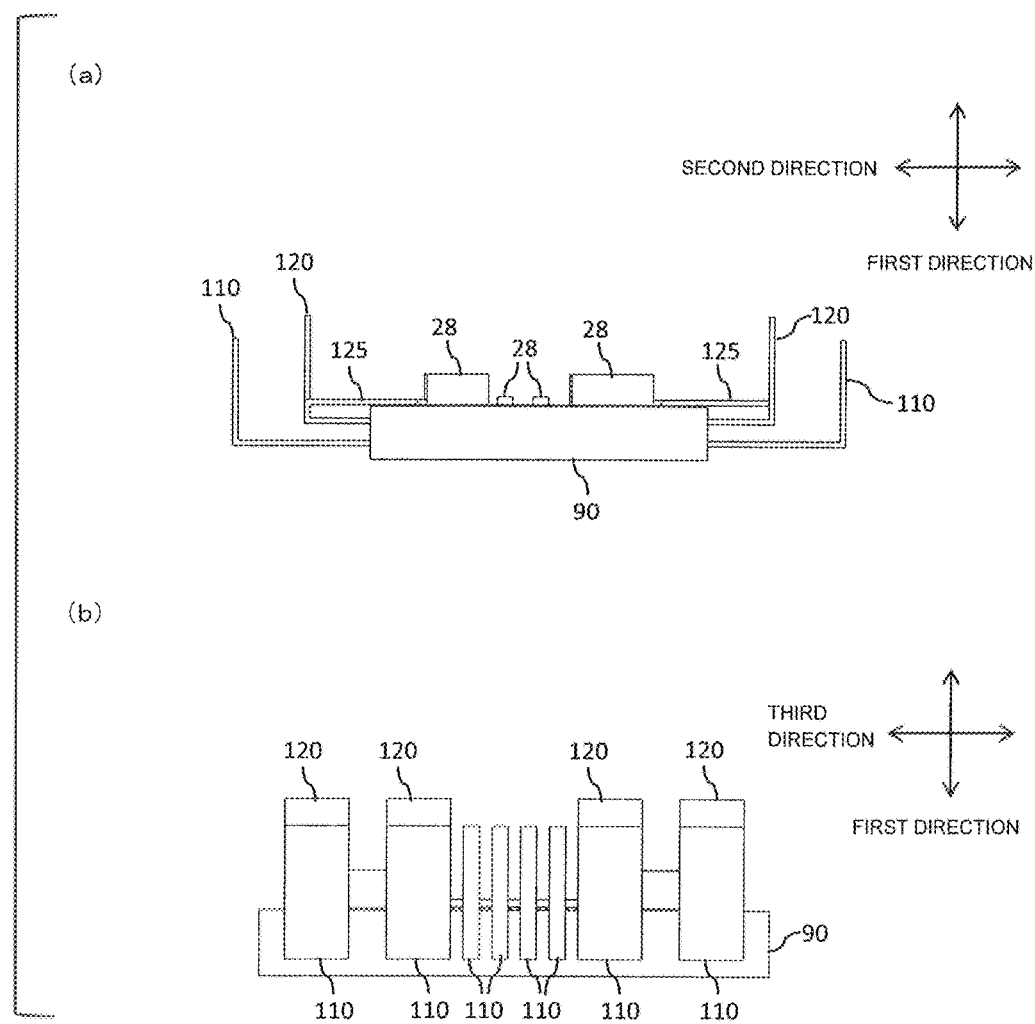
FIG. 13(a) is a side view of the electronic module to be used in the fifth embodiment of the present invention.
FIG. 13(b) is a side view in a different direction of the electronic module to be used in the fifth embodiment of the present invention.

In each embodiment, the aspect in which the first terminal part 110 and the second terminal part 120 are exposed outside the sealing part 90 from one side of the electronic module, is given and the structure of a so-called single inline package (SIP) is given. As illustrated in FIGS. 12 and 13, an aspect in which first terminal parts 110 and second terminal parts 120 are exposed outside a sealing part 90 from two opposed sides of an electronic module, is given and the structure of a so-called dual inline package (DIP) is given in the present embodiment. Any aspect described in the embodiments can be adopted in the present embodiment. Members the same as the members described in the embodiments, will be described with the same reference signs.

According to the present embodiment, because terminal parts 100 are exposed outside the sealing part 90 through the two sides, it is advantageous in that an increase can be made in the number of terminal parts 100 or an increase can be made in length in the width direction of each terminal part 100. In a case where the quantity of current is large, the length in the width direction of each terminal part 100 may be required to increase. By adoption of the present embodiment, it is advantageous in that the requirement can be satisfied.

In the aspect illustrated in FIG. 12, from the terminal parts 100 provided on the lower side of paper of FIG. 12(b), terminal parts 100 at both ends and three terminal parts 100 at a center in the third direction are second connecting terminals 125, and second terminal parts 120 are provided therebetween. From the terminal parts 100 provided on the upper side of paper of FIG. 12(b), second terminal parts 120 are provided at both ends in the third direction and five second connecting terminals 125 are provided between the second terminal parts 120.

In the present embodiment, as illustrated in FIG. 13, the one-side end of each first, terminal part 110 and the one-side end of each second terminal part 120 are not at substantially identical positions, and thus the one-side end of each second terminal part 120 is positioned closer to one side than the one-side end of each first terminal part 110 is.

Sixth Embodiment

Next, a sixth embodiment of the present invention will be described.

Figure 14:
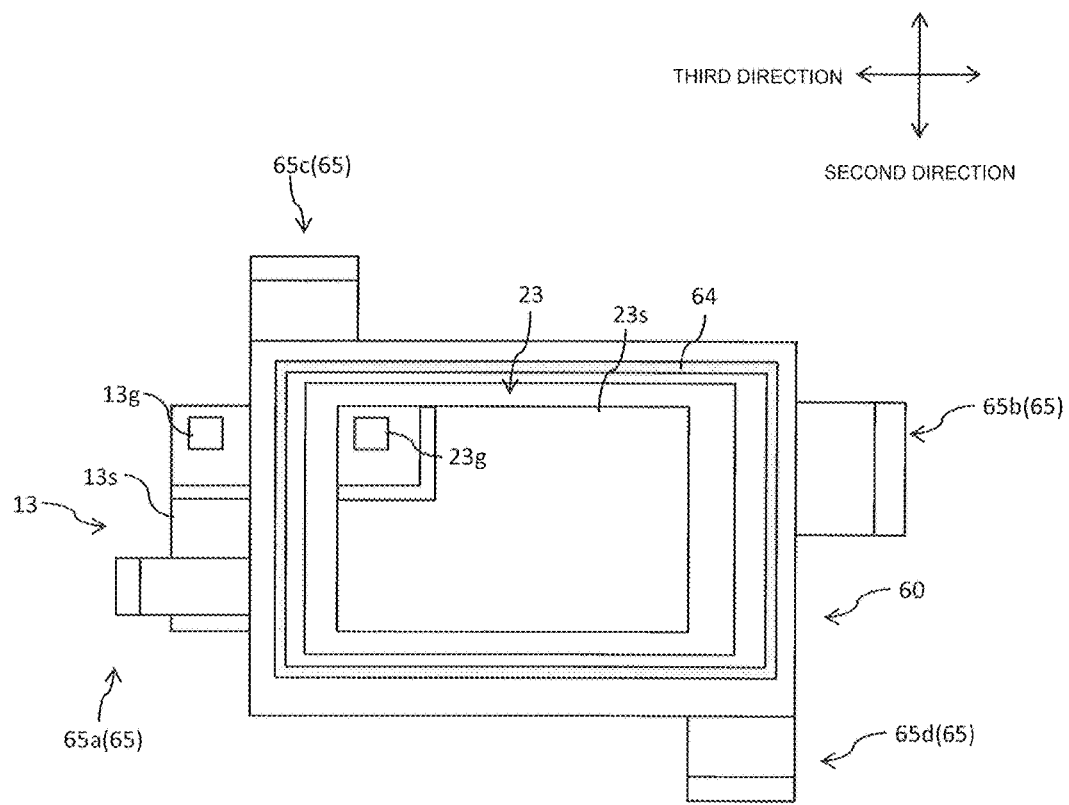
FIG. 14 is a plan view of a first connecting body to be used in a sixth embodiment of the present invention.

Although a first connecting body 60 having a substantially T-shaped section is used in each embodiment, a first connecting body 60 according to the present embodiment has four supporting parts 65 (65a to 65d) extending from a first head part 61 to the other side, as illustrated in FIG. 14. The supports 65 abut on a one-side first conductive layer 12 or a first substrate 11. The present embodiment can adopt any aspect described in the embodiments. Members the same as the members described in the embodiments, will be described with the same reference signs.

The present embodiment will be described with an aspect in which the four supporting parts 65 are used, but is not limited to this. Thus, one, two, three, or five or more supporting parts 65 may be used.

In a case where the supporting parts 65 extending from the first head part 61 are provided as in the present embodiment, the first connecting body 60 can be prevented from inclining due to the weight of an other-side second electronic component 23 at implementation of the other-side second electronic component 23 or after the implementation of the other-side second electronic component 23. The supporting parts 65 abut on the first substrate 11 or the one-side first conductive layer 12 in this manner, so that heat dissipation can improve. Particularly in a case where the supporting parts 65 abut on the one-side first conductive layer 12, it is advantageous in that heat dissipation can further improve.

In a case where the plurality of supporting parts 65 is provided as in the present embodiment, it is advantageous in that the first connecting body 60 can be provided more stably and higher heat dissipation can be achieved.

Seventh Embodiment

Next, a seventh embodiment of the present invention will be described.

Figure 15:
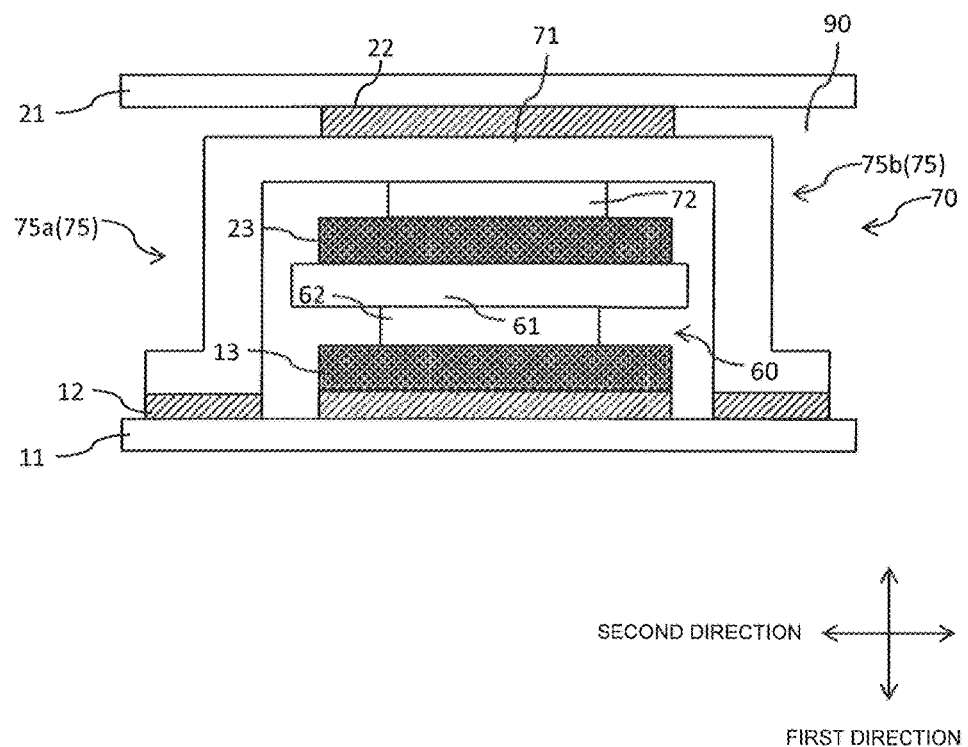
FIG. 15 is a longitudinal sectional view of a second connecting body to be used in a seventh embodiment of the present invention.

Although each embodiment has been described with a second connecting body 70 having a second pillar part 72 and having a substantially T-shaped section, as illustrated in FIG. 15, a second connecting body 70 has extending parts 75 (75a and 75b) extending from a second head part 71 to the other side, in the present embodiment. The present embodiment can adopt any aspect described in the embodiments. Members the same as the members described in the embodiments, will be described with the same reference signs.

The present embodiment will be described with an aspect in which the two extending parts 75 are used, but is not limited to this. Thus, one, or three or more extending parts 75 may be used.

According to the present embodiment, because the extending parts 75 are provided, heat from an other-side second electronic component 23 can be dissipated efficiently. Thus, the second connecting body 70 can achieve high heat dissipation.

In a case where the plurality of extending parts 75 is provided as in the present embodiment, it is advantageous in that higher heat dissipation can be achieved.

Eighth Embodiment

Next, an eighth embodiment of the present invention will be described.

Figure 16:
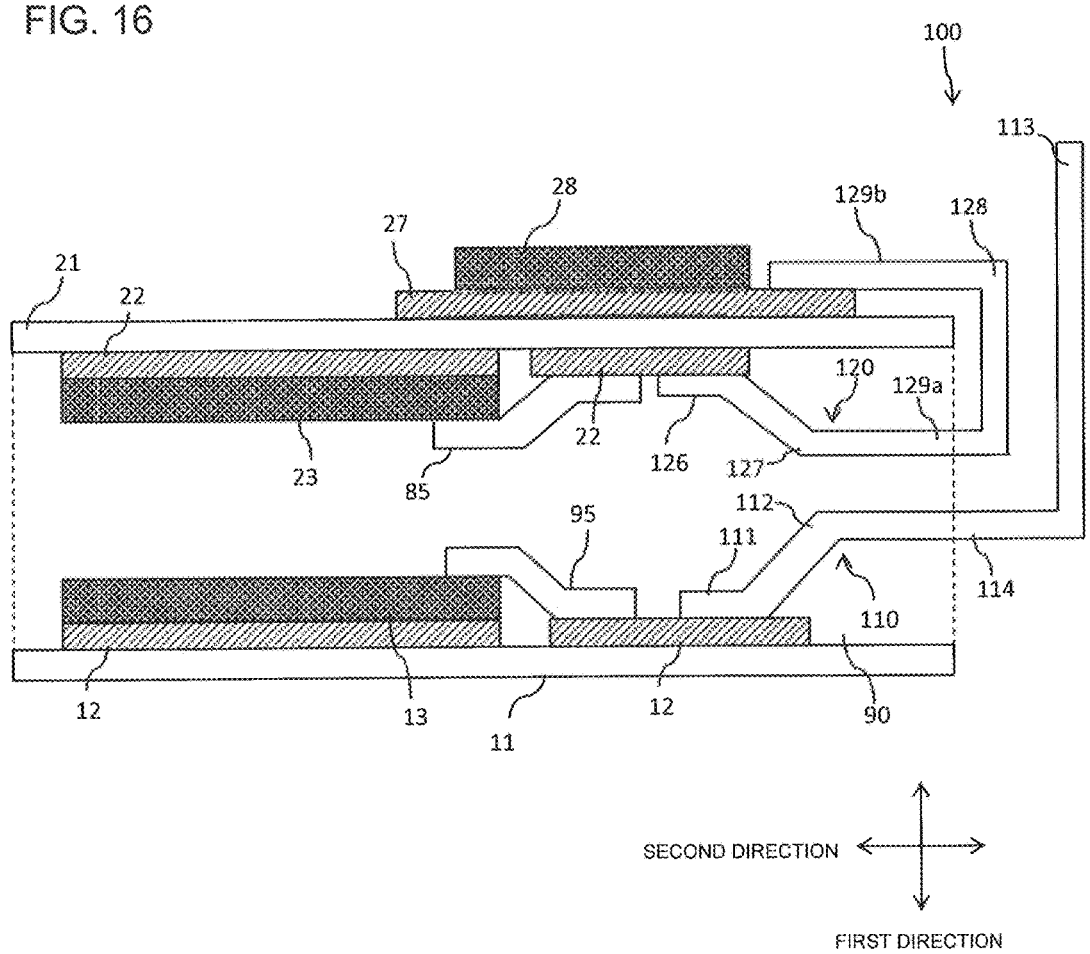
FIG. 16 is a longitudinal sectional view of an electronic module to be used in an eighth embodiment of the present invention.

Each embodiment has been described with the aspect in which a first connecting body 60 and a second connecting body 70 are used, but is not limited to this. As illustrated in FIG. 16, no first connecting body 60 and no second connecting body 70 may be provided. The present embodiment can adopt any aspect described in the embodiments. Members the same as the members described in the embodiments, will be described with the same reference signs.

In the present embodiment, the effect described above can be acquired in addition to the effect described for the connecting terminals 115 and 125.

Two or more substrates are not necessarily used, and thus only one substrate (second substrate 21 in an aspect illustrated in FIG. 17) may be provided as illustrated in FIG. 17.

The description of the embodiments and the disclosure of the drawings described above are merely examples for explaining the invention described in the claims, and the invention described in the claims is not limited by the description of the embodiment or the disclosure of the drawings described above. In addition, the recitation of the claims at the original application is merely an example, and the recitation of the claims can be appropriately changed based on the description of the specification, the drawings, and the like.

REFERENCE SINGS LIST 11 first substrate (substrate)
13 one-side first electronic component (one-side electronic component, first electronic component)
18 other-side first electronic component (other-side electronic component, first electronic component)
21 second substrate (substrate)
23 other-side second electronic component (other-side electronic component, second electronic component)
28 one-side second electronic component (one-side electronic component, second electronic component)
110 first terminal part
113 first normal-direction extending part
114 first planar-direction extending part
115 first connecting terminal (connecting terminal)
118 first connecting part (connecting part)
119a other-side first extending part (other side extending part)
119b on side first extending part (one-side extending part)
120 second terminal part
123 second normal-direction extending part
124 second planar-direction extending part
125 second connecting terminal (connecting terminal)
128 second connecting part (connecting part)
129a other-side second extending part (other-side extending part)
129b one-side second extending part (one-side extending part)

The invention claimed is:
1. An electronic module comprising:
a substrate;
an other-side electronic component provided on the other side of the substrate;
a one-side electronic component provided on the one side of the substrate;
a sealing part sealing the other-side electronic component; and
a connecting terminal having an other-side extending part extending to circumferential outside of the substrate on the other side of the substrate, the other-side extending part being exposed outside the sealing part, a one-side extending part extending to circumferential outside of the substrate on one side of the substrate, the one-side extending part being outside the sealing part, and a connecting part connecting the other-side extending part with the one-side extending part at the circumferential outside of the substrate, the connecting part being outside the sealing part, the connecting terminal electrically connecting the other-side electronic component in the sealing part with the one-side electronic component outside the sealing part,
wherein the one-side extending part, the other-side extending part, and the connecting part are integrally formed,
the other-side extending part is provided on an other side conductive layer provided on the other side of the substrate and the one-side extending part is provided on a one-side conductive layer provided on one side of the substrate, or the other-side extending part is provided on a surface on the other side of the substrate, the other side including a metal substrate and the one-side extending part is provided on a surface on one side of the substrate, the one side including the metal substrate, and the surface on the other side of the substrate is entirely provided in the sealing part, and the surface on one side of the substrate is not sealed by the sealing part.

2. The electronic module according to claim 1, wherein the substrate has a first substrate and a second substrate which is provided on one side of the first substrate,
the other-side electronic component has an other-side second electronic component provided on an other side of the second substrate,
the one-side electronic component has a one-side second electronic component provided on one side of the second substrate, and
the connecting terminal has a second connecting terminal, which has an other-side second extending part extending to circumferential outside of the second substrate on the other side of the second substrate, a one-side second extending part extending to circumferential outside of the second substrate on one side of the second substrate, and a second connecting part connecting the other-side second extending part with the one-side second extending part at circumferential outside of the second substrate, and the second connecting terminal electrically connects the other-side second electronic component with the one-side second electronic component.

3. The electronic module, according to claim 2, further comprising
a first electronic component provided on the one side of the first substrate; and
a first terminal part, which is provided on a first substrate side, electrically connected with the first electronic component,
wherein the first terminal part has a first planar-direction extending part extending in a planar direction of the first substrate, and a first normal-direction extending part, which is provided at an end of the first planar-direction extending part, extending to one side or the other side.

4. The electronic module according to claim 3, wherein the first normal-direction extending part extends to one side at circumferential outside of the second connecting part.

5. The electronic module according to any one of claim 1, wherein
the substrate has a first substrate and a second substrate which is provided on one side of the first substrate,
the other-side electronic component has an other-side first electronic component provided on an other side of the first substrate,
the one-side electronic component has a one-side first electronic component provided on one side of the first substrate,
the connecting terminal has a first connecting terminal, which has an other-side first extending part extending to circumferential outside of the first substrate on the other side of the first substrate, a one-side first extending part extending to circumferential outside of the first substrate on the one side of the first substrate, and a first connecting part connecting the other-side first extending part with the one-side first extending part at circumferential outside of the first substrate, and the first connecting terminal electrically connects the other-side first electronic component with the one-side first electronic component.

6. The electronic module according to any one of claim 1, wherein the substrate has a first substrate and a second substrate which is provided on one side of the first substrate, the electronic module further comprising a second terminal part, which is provided on a second substrate side, electrically connected with a second electronic component, wherein the second terminal part has a second planar-direction extending part extending in a planar direction of the second substrate, and a second normal-direction extending part, which is provided at an end of the second planar-direction extending part, extending to one side or the other side.

* * * * *